United States Patent [19]

Ohashi et al.

[11] 4,368,481
[45] Jan. 11, 1983

[54] LIGHT-DRIVEN SEMICONDUCTOR DEVICE

[75] Inventors: Hiromichi Ohashi; Yoshihiro Shirasaka, both of Yokohama, Japan

[73] Assignee: Tokyo Shibaura Denki Kabushiki Kaisha, Japan

[21] Appl. No.: 158,324

[22] Filed: Jun. 10, 1980

[30] Foreign Application Priority Data

| Jun. 19, 1979 [JP] | Japan | 54/77148 |
| Oct. 29, 1979 [JP] | Japan | 54/138659 |
| Oct. 31, 1979 [JP] | Japan | 54/140663 |

[51] Int. Cl.³ .................................................. H01L 27/14
[52] U.S. Cl. ...................................... 357/30; 357/19; 357/38
[58] Field of Search .......................... 357/30, 38, 19

[56] References Cited

U.S. PATENT DOCUMENTS

| 3,920,495 | 11/1975 | Roberts | 357/19 X |
| 4,100,562 | 7/1978 | Lugawara | 357/19 |
| 4,131,905 | 12/1978 | Hanes | 357/38 X |
| 4,167,746 | 9/1979 | Storm | 357/30 |
| 4,186,409 | 1/1980 | McMullin | 357/30 X |
| 4,233,619 | 11/1978 | Webb | 357/30 X |

FOREIGN PATENT DOCUMENTS

50-79288 of 1975 Japan.

*Primary Examiner*—Martin H. Edlow
*Attorney, Agent, or Firm*—Finnegan, Henderson, Farabow, Garrett & Dunner

[57] ABSTRACT

A light-driven semiconductor device comprises an optical fiber having an output end located in the vicinity of a light sensitive area of a light trigger thyristor and a silicone rubber interposed between the output end of said light guide and the light sensitive area and pressed against said light sensitive area by said output end, whereby said output end is located relatively to said light sensitive area and a light signal emitted from said output end is led to said light sensitive area.

16 Claims, 13 Drawing Figures

LIGHT-DRIVEN SEMICONDUCTOR DEVICE

BACKGROUND OF THE INVENTION

This invention relates to a light-driven semiconductor device, more specifically to a light-driven semiconductor device provided with a light-driven semiconductor element and a light guide for guiding a driving light signal from a light source to the element.

Newly developed are devices using a light activated thyristor (LASCR) as a light-driven semiconductor element which is controlled by a light signal. The devices of this type are characterized in that electrical insulation between the semiconductor element and a control section therefor is easy, and that unwanted operation is rarely caused by noise. In consideration of their character, these devices are expected to be applied to high-voltage power control systems.

For the following reasons, these light-driven semiconductor devices are subject a defect that it is difficult to control the locations of a light guide to guide a light signal to a light sensitive area of the semiconductor element and the light sensitive area. In these devices, the semiconductor element is generally tightened by cooling fins under high pressure, e.g. 100 kg/cm² or more. Therefore, if the output end of the light guide is previously brought in contact with the light sensitive area, the contact portion may suffer severe distortion to cause malfunction of the device. Accordingly, the output end of the light guide must be separated from the light sensitive area by a distance through which the semiconductor element and/or light guide is shifted at the tightening. Practically, however, it is hard to keep them apart at such distance with high accuracy, and they are subject to variations in shifted distance. In consideration of these circumstances, the output end of the light guide and light sensitive area are separated by a considerably margin. As a result, it is difficult to align the optical axes of the two sections with high accuracy. Moreover, the output end is shifted even after location, so that the optical axes will possibly fail to align after manufacture. Furthermore, as the output end of the light guide becomes to apart from the light sensitive area of the semiconductor device the light transmitting efficiency therebetween becomes decrease.

SUMMARY OF THE INVENTION

Accordingly, the object of this invention is to provide a light-driven semiconductor device capable of easy optical axis alignment between the output end of the light guide and the light sensitive area of the semiconductor element, and minimizing undesired shifting of the output end after location thereof, thereby ensuring high optical coupling efficiency.

DETAILED DESCRIPTION OF THE PREFERRED EMBODIMENTS

Now there will be described a light-driven semiconductor device according to an embodiment of this invention with reference to the accompanying drawings.

Figure 1:
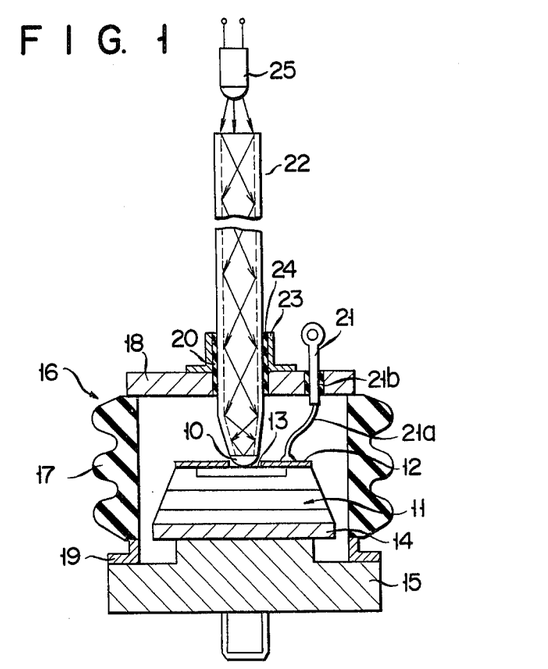
FIG. 1 is a sectional view showing a stud-type trigger thyristor device according to an embodiment of this invention.

FIG. 1 shows a stud-type light trigger thyristor which has a semiconductor element or body 11. The semiconductor element 11 is formed of silicon, and has a well-known four-layer structure including P-, N-, P- and N-type layers arranged ascendingly. An annular aluminium electrode 12 is formed on the top side or cathode-emitter side of the element 11. The aluminium electrode 12 serves as a cathode, and the semiconductor element 11 is partially exposed through a center hole of the electrode 12 to form a light sensitive area 13. The diameter of the light sensitive area 13 surrounded by the electrode 12 is minimized for a certain reason mentioned later. The bottom side or anode-emitter side of the semiconductor element 11 is fixed to a metal anode 15 by means of a metal plate 14 formed of tungsten or molybdenum. The metal plate 14 has a function to provide thermal and mechanical conformity between the semiconductor element 11 and the anode 15. The anode 15 is so set as to block up a bottom open end of a cylindrical insulator 17, the anode 15 and the insulator 17 being airtightly connected by means of a metal cylinder 19. A top open end of the insulator 17 is fitted with a metal cover 18 which has a light guide insertion hole 20 bored in its center. Thus, the insulator 17 and metal cover 18 form an envelope 16 which airtightly contains the semiconductor element 11. The insertion hole 20 of the metal cover 18 is coaxial with the light sensitive area 13 and is considerably larger than the area 13 in diameter. Further, the metal cover 18 is electrically insulated by an insulating member 21b, and is fixedly penetrated by an external electrode 21. The external electrode 21 is connected with one end of a lead wire 21a the other end of which is connected to the cathode.

Figure 2:
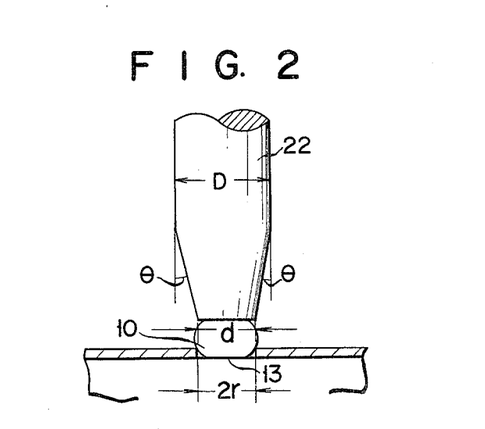
FIG. 2 shows an output terminal portion of a light guide used with the trigger thyristor device of FIG. 1.

In FIG. 1, numeral 22 designates a light guide serving as a light signal transmission path which is composed of a single optical fiber consisting of a lead glass core with a high refractive index and cladding material with a low refractive index surrounding the core. As shown in detail in FIG. 2, an output end portion of the light guide 22 is tapered from its proximal part with a diameter D toward the tip with a taper angle $\psi$ ($\psi = 2\theta$). The diameter d of the tip end face of the light guide 22 is substantially equal to the diameter 2r of the light sensitive area 13. The tip portion of the light guide 22 is inserted into the envelope 16 through the light guide insertion hole 20 of the metal cover 18, and the light guide 22 is airtightly fixed at the light guide insertion hole 20 with the tip end face in close vicinity to the light sensitive area 13. The location of the light guide 22 is attained by pressing the tip end face against an elastic body 10 which is formed of material with substantially the same refractive index as that of the core of the light guide 22 and light transmissibility, e.g. silicone rubber, and is disposed at the light sensitive area 13. Moreover, the fixation of the light guide 22 is achieved by fitting an insulating cylinder 24 on the light guide 22 and then fixing the insulating cylinder 24 to the metal cover 18 by means of a fixing metal cylinder 23. On the input side of the light guide 22, there is a light source 25 such as a gallium arsenide light emitting diode, from which a light signal output is applied to the semiconductor element 11 through the light guide 22.

Now there will be described the operation or function of the light-driven semiconductor device of the above-mentioned construction.

A light signal from the light source 25 transmitted through the core of the light guide 22 is condensed at the tip or taper portion of the light guide 22 and projected on the light sensitive area 13 of the semiconductor element 11 via the elastic body 10. The semiconductor element 11 is triggered by the condensed light signal, thereby performing a switching function to cause an electric circuit including a power source and a load to conduct.

Figure 3:
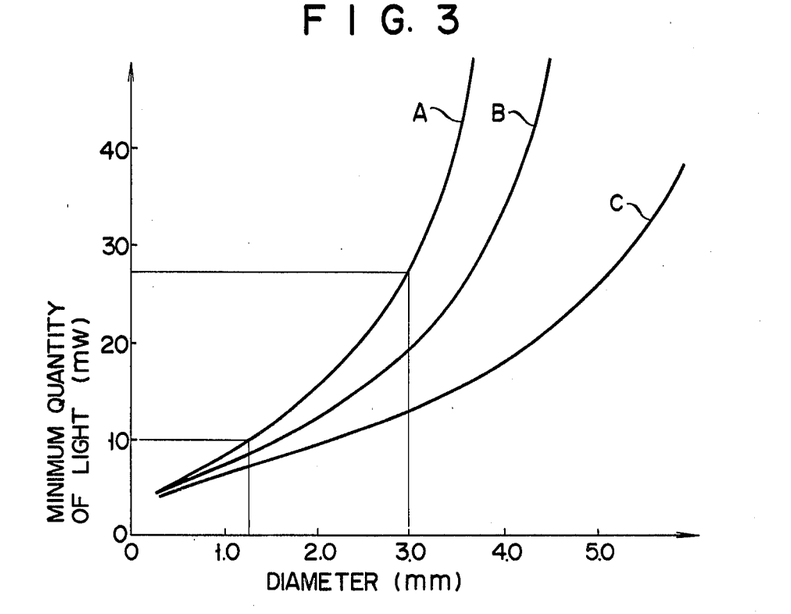
FIG. 3 is a diagram showing the general relationship between the critical off-state voltage build-up rate and the minimum quantity of light for ignition in a light-driven semiconductor device.

In general, the relationship between the critical off-state voltage build-up rate and the minimum quantity of light for trigger varies with the diameter 2r of the light sensitive area, as shown in FIG. 3. If the diameter 2r of the light sensitive area is 3.0 mm, for example, the minimum quantity of light for ignition need be approximately 27 mW to trigger a thyristor with a dv/dt ability of 1,500 V/$\mu$S as represented by curve A. If the diameter 2r is 1.2 mm, on the other hand, the same thyristor with the critical off-state voltage build-up rate of 1,500 V/$\mu$S can be ignited with the minimum quantity of light for ignition of only 10 mW. In consequence, it holds true also for thyristors with other critical off-state voltage build-up rates that the smaller the diameter of the light sensitive area, the smaller the minimum quantity of light for trigger will be. With critical off-state voltage build-up rates of 1,000 V/$\mu$S and 500 V/$\mu$S, for example, we obtain such relationships as represented by curves B and C of FIG. 3, respectively.

Figure 4:
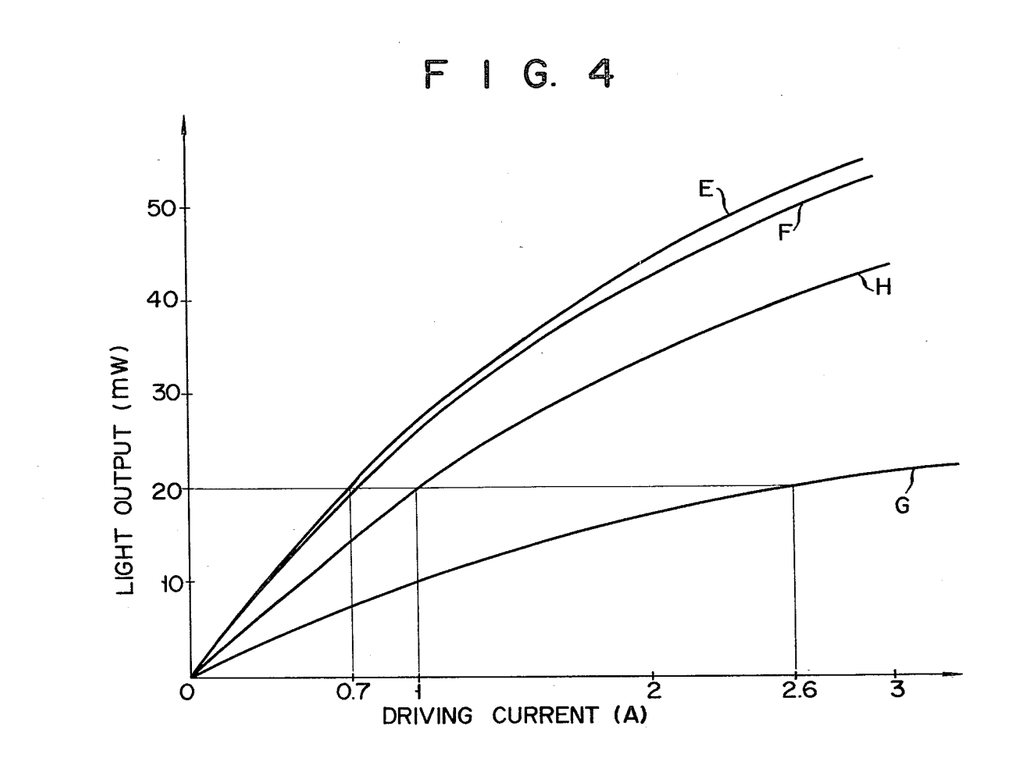
FIG. 4 is a diagram showing the relationship between the diameter of the light guide and light source driving current.

Thus, it will be understood that the diameter of the light guide should preferably be minimized correspondingly to the diameter 2r of the light sensitive area. Generally, however, the light guide is deteriorated in light signal transmitting efficiency as its diameter is reduced. Therefore, the light guide should preferably have a greater diameter to avoid using a light source with high intensity of light emission. When supplying a light signal of 20 mW to the light sensitive area of the semiconductor element or thyristor, for example, the relationship between the diameter D of the light guide and the driving current of the light source is as shown in FIG. 4. Namely, with light guides with the diameter D of 2 mm and 3 mm as represented respectively by curves E and F, the driving current of the light source need be approximately 0.7 A to provide a light signal output of 20 mW. With a light guide with the diameter D of 1 mm as represented by curve G, moreover, the driving current need be as great as 2.6 A to provide the same light signal output. These data were obtained as a result of an experiment conducted on a single light guide of 10 cm length by the inventors hereof.

Generally, in a light trigger thyristor, it is necessary that a light signal of a quantity twice or thrice as great as the minimum quantity of light for trigger be supplied to the light sensitive area to obtain good turn-on characteristic. Accordingly, in order to perform stabilized operation of the device with the small diameter D of the light sensitive area, an extremely high light source driving current will be required, constituting a main cause of the deterioration of the light source in life performance.

In the device of the aforementioned embodiment, the output end portion of the light guide 22 with the diameter D is tapered with the given taper angle $\psi$ ($\psi=2\theta$) so that the diameter d of the tip portion is substantially equal to the diameter 2r of the light sensitive area 13. When the output end portion of a light guide with D=2 mm was tapered with tan $\theta$=0.3 to provide the tip portion diameter d=1 mm, for example, there was obtained such a characteristic as represented by curve H of FIG. 4. That is, despite the tip portion diameter d of the light guide as short as 1 mm, the light source driving current necessary to provide the light signal output of 20 mW need be as low as approximately 1 A. An experiment conducted by the inventors hereof revealed that the aforesaid effect is noticeable with tan $\theta$<0.3. Thus, the photo-thyristor with the dv/dt ability of 1,500 V/$\mu$S can securely be driven with the light driving current of only 1 A.

Figure 5:
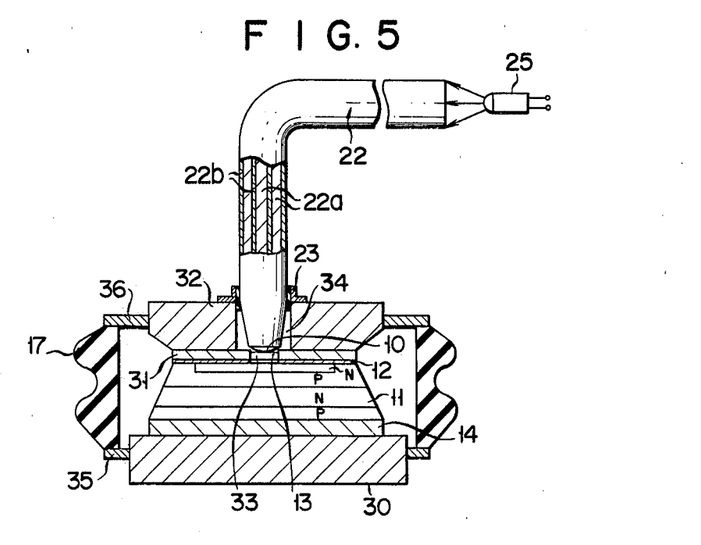
FIGS. 5 to 8 show light-driven semiconductor devices according to several alternative embodiments of the invention.

A light-driven semiconductor device according to another embodiment of the invention, as shown in FIG. 5, is composed of a combination of a semiconductor device of the so-called flat package type in which both electrodes of a semiconductor element is pressed by a metal stamp electrode and a light guide formed of a bundle of optical fibers. In FIG. 5, the under surface of a semiconductor element 11 is fixed to an anode stamp electrode 30 by means of a metal plate 14. A light sensitive area 13 defined by a center hole of an annular aluminium electrode 12 attached to the top surface of the semiconductor element 11 has a small diameter of approximately 1.0 mm. A cathode stamp electrode 32 is fixed to the top surface of the aluminium electrode 12 by means of a metal plate 31 formed of the same material of the metal plate 14. The metal plate 31 is provided with a coaxial hole with the same diameter as that of the center hole of the aluminium electrode 12. In this coaxial hole, a light transmitting plate 33 is airtightly fixed so as to cover an exposed portion of the semiconductor element 11 at the light sensitive area 13. In the cathode stamp electrode 32, a light guide insertion hole 34 with a larger diameter than that of the light sensitive area 13 is bored coaxially with the light sensitive area 13. The anode stamp electrode 30 and the cathode stamp electrode 32 are fixed so as to block up the openings of a cylindrical insulator 17 by means of metal rings 35 and 36 respectively at both ends of the insulator 17. Thus, the semiconductor element 11 inside the insulator 17 is hermetically sealed from the outside. A light guide 22 is formed by assembling a plurality of optical fibers 22a made of quartz glass with plastic claddings 22b interposed among the fibers. Formed at an output end portion of the light guide 22 is a taper whose end face is in contact with a light transmitting elastic body 10, such as silicone rubber, formed on the light transmitting plate 33. The light guide 22 is fixedly attached to the cathode stamp electrode 32 by means of a fitting member 23.

Figure 6:
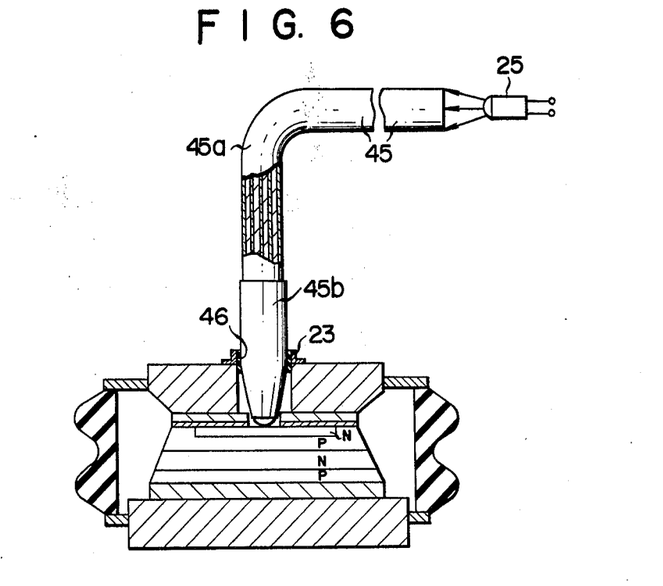

A light-driven semiconductor device according to an embodiment shown in FIG. 6 is quite the same as the semiconductor device of FIG. 5 except the structure of the light guide. In a light guide 45, a portion extending from a light source 25 to the vicinity of the semiconductor device is formed of an optical fiber bundle 45a, and the remaining portion is formed of a single thick optical fiber 45b. The former 45a is larger than the latter 45b in diameter, and a taper is formed at an output end portion of the latter 45b. The former 45a is flexible, while the latter 45b is rigid. As a result, maintenance and inspection of the light signal transmission path, as well as handling of wires, become relatively easy, ensuring electrical and mechanical connections with the semiconductor element (light activated thyristor).

Figure 7:
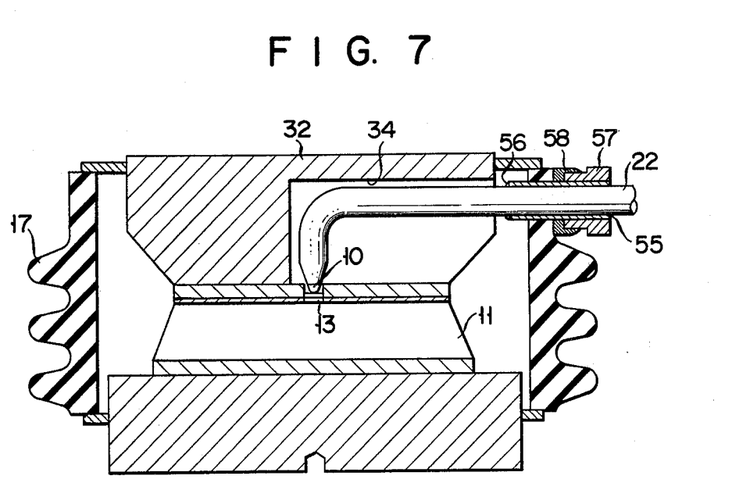

In a light-driven semiconductor device according to an embodiment shown in FIG. 7, a light guide is led out through an insulator. This device is constructed as follows. A cathode stamp electrode 32 is provided with a light guide insertion hole 34 extending from part of the lateral side of the electrode 32 to a light receiving section 13 of a semiconductor element 11. Further, a through hole is bored in an insulator 17 so as to face the insertion hole 34 of the cathode stamp electrode 32. A light guide 22 is inserted in the insulator 17 through this through hole, the tip portion of the light guide 22 is guided to the light sensitive area 13 through the insertion hole 34, and the tip end face is pressed against a light transmitting elastic body 10. The light guide 22, which is formed of a single optical fiber, has a taper at its output end portion. The middle portion of the light guide 22 is fitted in and fixed to a sleeve 55 by means of an adhesive agent 56. Further, the sleeve 55 is inserted through the through hole in the insulator 17 and also through a connector 57 outside the insulator 17. The connector 57, sleeve 55 and insulator 17 are fixed together by means of an adhesive agent 58. Thus, the light guide 22 is airtightly fixed relatively to the insulator 17. The sleeve 55, which is formed of a metal such as Copal (trademark for an iron-nickel-cobalt alloy from Westinghouse Co., USA), alleviates the influence of thermal expansion of the insulator 17 on the light guide 22. The adhesive agents 56 and 58 are made of soft glass which is liquid at a temperature below 500° C. The bonding of the insulator 17 and the sleeve 55 is made by using a solder sealing material such as lead-tin solder.

Figure 8:
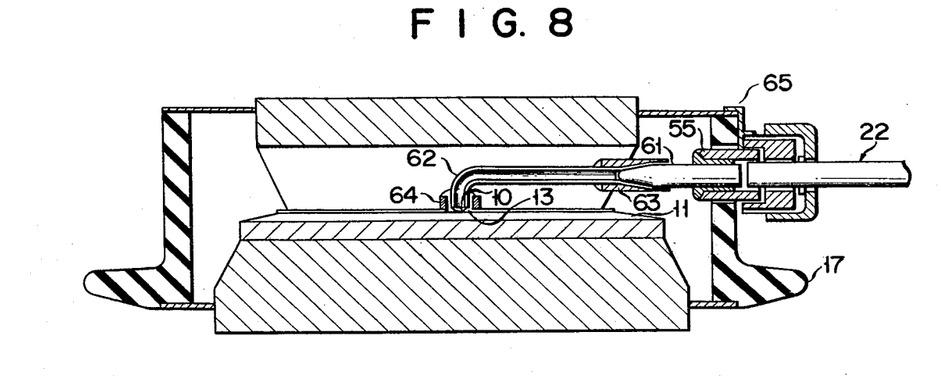
Figure 9:
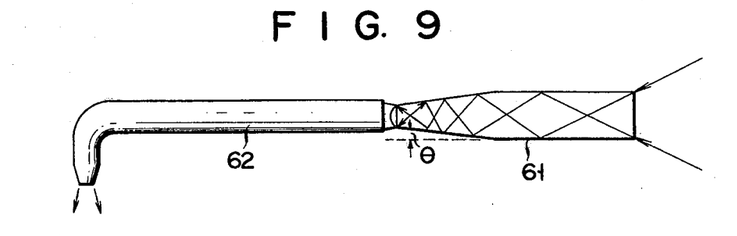
FIG. 9 shows the way of transmission of a light signal through the light guide.

Like the device shown in FIG. 7, a light-driven semiconductor device according to an embodiment shown in FIG. 8 is so designed that a light guide is introduced into an envelope through an insertion hole of an insulator 17. A light guide 22 is composed of a proximal section 60 extending from a light source to the insulator 17, a distal section 62 extending to a light sensitive area 13 of a semiconductor element 11, and a middle section 61 connecting the proximal section 60 and the distal section 62. The proximal end portion of the middle section 61 is fitted in a metal sleeve 55, and the former is fixed to the latter by means of low-melting-point glass-filled therebetween. Fixed to the insulator 17, moreover, the metal sleeve 55 is previously hermetically sealed against the envelope. The distal end portion of the middle section 61 is tapered, and the tip end face of the middle section 61 is optically connected with the proximal end face of the distal section 62. This connection is made by inserting both these end faces into a sleeve 63 for optical axis alignment, and fixing them by means of low-melting-point glass. An output end portion of the distal section 62 of the light guide 22 is tapered, brought in contact with an elastic body 10 with substantially the same refractive index as that of the light guide 22, located and fixed by a ring 64 for optical axis alignment. Such fixation can be achieved by using the same material of the elastic body 10, e.g. silicone rubber. The proximal end portion of the middle section 61 is optically connected with the distal end portion of the proximal section 60. Numeral 65 designates a conductor which electrically connects the proximal section 60 of the light guide 22 with a cathode 32 to equalize their potentials.

In the device of FIG. 8, the diameter of the light signal input side or proximal end portion of the middle section 61 of the light guide 22 can be made large in conformity with the diameter of the proximal section 60, so that the efficiency of optical coupling with the light source can be given top priority in selecting the diameter of the proximal section 60. If the taper angle $\theta$ of the middle section of the light guide is $\theta \leq 20°$ to 30°, the quantity of transmitted light will be 80 to 90% of the quantity of light transmitted without a taper surface.

If a taper surface is formed at the middle section 61 of the light guide, the output angle tends to become larger than the angle of incidence when the light signal passes through the tapered portion, thereby deteriorating the efficiency of optical coupling with the distal section 62. The output angle can be made larger than the incidence angle by giving lens effect or focussing function to the elastic body 10 on the output side of the distal section 62 or, for example, forming the elastic body 10 into the shape of a hemisphere. The distal section 62 of the light guide 22 may previously be fixed to the light sensitive area 13 by using the ring 64 for optical axis alignment and silicone rubber or other adhesive agent before the semiconductor element 11 is fixed to the anode 30, and the distal section 62 and the middle section 61 can be connected while aligning their optical axes by means of the sleeve 63 for optical alignment and silicone rubber or other adhesive agent when fixing the semiconductor element 11 to the anode 30. Accordingly, the light signal from the middle section 61 of the light guide 22 may be transmitted to the light sensitive area 13 without any substantial loss. Such improvement in transmitting efficiency enables a light emitting diode, which has hardly been used due to its low efficiency of optical coupling with light transmission system in spite of the lower cost and longer life as compared with a laser diode, etc., to be used as a light signal source.

In the device shown in FIG. 8, each of the middle section 61 and the distal section 62 of the light guide 22 is preferably formed of a single thick optical fiber, and the proximal section 60 is preferably formed of an optical fiber bundle.

Figure 10:
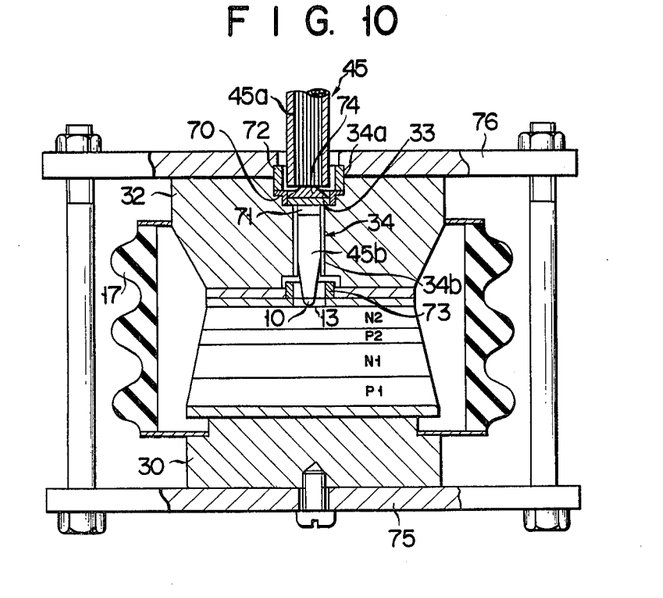
FIG. 10 shows a light-driven semiconductor device according to a further embodiment of the invention.

A light-driven semiconductor device according to an embodiment shown in FIG. 10 is so constructed that a light guide in a stud-type light trigger thyristor device is divided into two sections to facilitate and ensure optical axis alignment between the light guide and a photo-thyristor element. In FIG. 10, an upper portion 34a of a light guide insertion hole 34 vertically formed along the central axis of a cathode stamp electrode 32 has a stepped portion, and is increased in diameter. A cylindrical metal tube 70 with a flange is set in the stepped portion of the upper portion 34a, and a light transmitting plate 33 is held inside and by the cylindrical tube 70. A distal section 45b of a light guide 45 is inserted in a smaller-diameter lower portion 34b of the light guide insertion hole 34 so as to be located between the light transmitting plate 33 and a light sensitive area 13 of a semiconductor element or photo-thyristor element 11. Like the one shown in FIG. 6, the distal section 45b is formed of a single thick optical fiber, and is tapered toward its tip end. The distal section 45b is fixed by elastic bodies 10 and 71 interposed respectively between the back side of the distal section 45b and the light transmitting plate 33 and between the tip end face of the section 45b and the light sensitive area 13 and having substantially the same refractive index as that of the core of the light guide. The elastic bodies 10 and 71 may be formed of silicone rubber. The elastic body 10 at the light sensitive area 13 is set while it is made substantially hemispheric by surface tension.

These elastic bodies 10, 71 may prevent the light guide 45 from a direct application of a mechanical stress which generates when the semiconductor element is pressed by a cooling fin 76 as described later, and also may increase a light coupling efficiency between the light guide 45 and light sensitive area 13 of the semiconductor body.

A suitable transparent adhesive agent, e.g. silicone oil, is applied to the top of the light transmitting plate 33, and the distal end of a proximal section or bundle section 45a of the light guide 45 is fixed to the light transmitting plate 33 through the silicone oil. The silicone oil forms a transparent film to function as a reflection preventive film 74 on the top of the light transmitting plate 33. Optical axis alignment between the proximal and distal sections 45a and 45b is performed by using a first cylindrical jig 72, and optical axis alignment between the distal section 45b and the light receiving section 13 is made by means of a second cylindrical jig 73.

Since the forward section 45a of the light guide may be moved with the jig 73 as a fulcrum, there may be prevented a decreasing of a light coupling efficiency due to the optical shift between the forward section 45a and light sensitive area 13 which generates when the cathode stamp electrode 32 is sealed to the insulation 17.

In FIG. 10, numerals 75 and 76 designate plate-like cooling fins which are fixed to an anode stamp electrode 30 and the cathode stamp electrode 32, respectively, and press and hold the photo-thyristor element 11 therebetween through means of these electrodes 30 and 32.

Figure 11A:
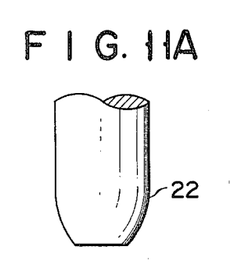
FIGS. 11A to 11C show several modifications of the tip portion of the light guide.
Figure 11B:
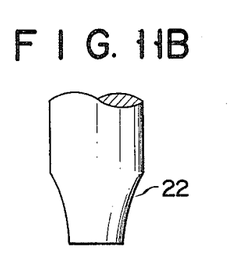
Figure 11C:
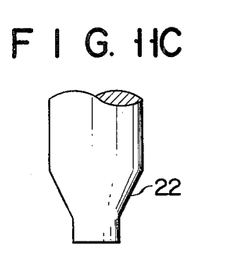

In this invention, the taper formed on the output side of the light guide 22 or 45 is not limited to the aforementioned straight shape, and it may, for example, be curved convexly as shown in FIG. 11A or concavely as shown in FIG. 11B. Alternatively, as shown in FIG. 11C, a taper may be formed only to the vicinity of the output end so that the portion of the outer periphery extending from the end of the taper to the output end is in parallel with the optical axis, that is, not tapered.

What we claim is:

1. A light-driven semiconductor device comprising:
    a light-driven semiconductor element having a light sensitive area;
    an envelope containing said element;
    a light guide having an output end located in the vicinity of said light sensitive area and an input end located outside said envelope, whereby a light signal supplied to said input end is guided and emitted from said output end; and
    an elastic body interposed between the output end of said light guide and the light sensitive area of said semiconductor element and pressed against said light sensitive area by said output end to cause elastic deformation of said elastic body, whereby said output end is located relatively to said light sensitive area and the light signal emitted from said output end is led to said light sensitive area.

2. A light-driven semiconductor device according to claim 1, wherein said light guide has a middle portion between said output and input ends and a taper portion between said middle portion and said output end, said output end being smaller in diameter than said middle portion and the light signal guided by said middle portion being condensed at said taper portion to be emitted from said output end toward said elastic body.

3. A light-driven semiconductor device according to claim 2, wherein said light guide is formed of a single optical fiber.

4. A light-driven semiconductor device according to claim 2, wherein said light guide is formed of an optical fiber bundle.

5. A light-driven semiconductor device according to claim 2, wherein said light guide is a combination of a tip portion formed of a single optical fiber located on the output end side where said taper portion is formed, and a proximal portion formed of an optical fiber bundle located on the input end side.

6. A light-driven semiconductor device according to any one of claims 3 to 5, wherein said elastic body is formed of a light transmitting material with substantially the same refractive index as that of a core of the optical fiber.

7. A light-driven semiconductor device according to claim 6, wherein said elastic body is formed of silicone rubber.

8. A light-driven semiconductor device according to claim 7, wherein said elastic body has the form of a partial sphere.

9. A light-driven semiconductor device according to claim 8, wherein said light-driven semiconductor element is a photo-thyristor.

10. A light-driven semiconductor device according to claim 9, wherein said photo-thyristor has a metal electrode with a through hole defining said light sensitive area.

11. A light-driven semiconductor device according to claim 10 further comprising a cylindrical body disposed on said metal electrode so as to surround the through hole of said electrode, the output end of said light guide being fixedly inserted in said cylindrical body.

12. A light-driven semiconductor device according to claim 2, which includes a cathode electrode having a light guide insertion hole in which said taper portion is inserted and from which said middle portion is extended.

13. A light-driven semiconductor device according to claim 12, wherein said middle portion is spaced from a small diameter portion continued to the taper portion and a large diameter portion continued to the input end by a predetermined distance.

14. A light-driven semiconductor device according to claim 13, which further includes a light transmitting plate fixed in the light guide insertion hole of the cathode electrode between the large diameter portion and small diameter portion of the optical guide and an elastic body pressed between the light transmitting plate and the small diameter portion.

15. A light-driven semiconductor device according to claim 14, which includes an elastic transparent film provided between the large diameter portion of the optical guide and the light transmitting plate to fix the large diameter portion onto the light transmitting plate.

16. A light-driven semiconductor device according to claim 15, which further includes first and second cylindrical jigs, the second jig surrounding the output end of the optical guide to align the output end with the light sensitive area and the first jig surrounding the large diameter portion to align the large diameter portion with the small diameter portion.

* * * * *